(12) United States Patent
Chae et al.

(10) Patent No.: US 8,949,680 B2
(45) Date of Patent: Feb. 3, 2015

(54) DATA RECEIVER DEVICE AND TEST METHOD THEREOF

(71) Applicant: Samsung Electronics Co., Ltd., Suwon-si, Gyeonggi-do (KR)

(72) Inventors: Hyun Su Chae, Seoul (KR); Jong Shin Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 77 days.

(21) Appl. No.: 13/755,576

(22) Filed: Jan. 31, 2013

(65) Prior Publication Data
US 2013/0268819 A1    Oct. 10, 2013

(30) Foreign Application Priority Data

Apr. 4, 2012 (KR) ........................ 10-2012-0035127

(51) Int. Cl.
*G01R 31/28* (2006.01)
*G06F 11/00* (2006.01)
*G01R 31/3177* (2006.01)
*G01R 31/317* (2006.01)

(52) U.S. Cl.
CPC ...... *G01R 31/3177* (2013.01); *G01R 31/31715* (2013.01)
USPC .......................................... 714/738; 714/733

(58) Field of Classification Search
CPC ..................... G01R 31/31813; G01R 31/2856
USPC .................................................. 714/733, 738
See application file for complete search history.

(56) References Cited

U.S. PATENT DOCUMENTS

| 4,891,809 | A | * | 1/1990 | Hazawa ........................ 714/703 |
| 5,349,587 | A | * | 9/1994 | Nadeau-Dostie et al. .... 714/729 |
| 6,070,255 | A | * | 5/2000 | Dell et al. ........................ 714/48 |
| 6,760,857 | B1 | | 7/2004 | Lau et al. |
| 7,017,090 | B2 | | 3/2006 | Endou et al. |
| 7,103,800 | B2 | | 9/2006 | Hasako et al. |
| 7,734,967 | B2 | | 6/2010 | Chung et al. |
| 2002/0162069 | A1 | * | 10/2002 | Laurent ........................ 714/763 |
| 2003/0065996 | A1 | * | 4/2003 | Shimada et al. .............. 714/718 |
| 2003/0204795 | A1 | * | 10/2003 | Adams et al. ................. 714/718 |
| 2007/0234133 | A1 | | 10/2007 | Choo et al. |

FOREIGN PATENT DOCUMENTS

JP      09-247557       9/1997
JP      20070158535 A   6/2007

* cited by examiner

*Primary Examiner* — M. Mujtaba K Chaudry
(74) *Attorney, Agent, or Firm* — Volentine & Whitt, PLLC

(57) ABSTRACT

A data receiver device includes a logic unit configured to generate a test pattern signal, receive a test result signal in the test mode, and compare the test pattern signal with the test result signal to perform a test in the test mode. The data receiver further includes a system frequency control circuit configured to multiply a reference clock signal by a multiplication factor received from the logic unit and to output a test clock signal, an output terminal configured to serialize the test pattern signal based on the test clock signal and to output an output signal, and an input terminal configured to recover a data signal and a data clock signal from an input signal based on the output signal, to deserialize the data signal based on the data clock signal, and to output the test result signal to the logic unit.

20 Claims, 7 Drawing Sheets

DATA RECEIVER DEVICE AND TEST METHOD THEREOF

CROSS-REFERENCE TO RELATED APPLICATIONS

A claim of priority under 35 U.S.C. §119(a) is made to Korean Patent Application No. 10-2012-0035127, filed on Apr. 4, 2012, the disclosure of which is hereby incorporated by reference in its entirety.

BACKGROUND

Embodiments of the inventive concept relate to a data receiver device including built-in self-test functionality, and to a related method thereof.

A built-in self-test (BIST) is a test in which a chip itself determines whether it has an operational fault. BIST functionality is considered essential to verify the performance of chips developed in mass production. The BIST may examine a bit error rate (BER), a frequency, and other operational parameters of a chip.

BIST functionality of a chip is obtained by integrating BIST function blocks into the chip. At this time, implementation of the BIST function blocks differs depending on whether the chip is a transceiver chip including both a transmitter and a receiver, a chip including only a transmitter, or a chip including only a receiver.

In the cases of a transceiver chip and a chip including only a transmitter, the BIST function blocks can be integrated without increasing the area of the chip. On the other hand, in the case of a chip including only a receiver (i.e., a receiver chip), the integration of the BIST function blocks is not feasible or is too costly in terms of chip area and design resources.

As such, to achieve BIST functionality for a receiver chip, a transmitter including a transmitter phase-locked loop (PLL), a serializer, and an output driver may be mounted in the receiver chip. The PLL of the transmitter in particular includes multiple unit blocks and occupies a large area. As such, since the transmitter PLL is unrelated to the original functionality of the receiver chip, its integration creates an expenditure of design labor resources and increases a chip area.

Alternatively, the transmitter may be installed external the receiver chip, and the BIST may be performed through communication between the transmitter and the receiver. In this case, the provision of additionally designed blocks may be avoided, but the receiver itself cannot perform testing, and the testing is performed at a package level rather than a wafer level. Moreover, the cost of testing increases in mass production.

SUMMARY

According to some embodiments of the inventive concept, there is provided a data receiver device which is operative in a test mode and a normal mode. The data receiver device includes a logic unit configured to detect a current operational mode of the data receiver device and to generate a test pattern signal, receive a test result signal in the test mode, and compare the test pattern signal with the test result signal to perform a test in the test mode. The data receiver further includes a system frequency control circuit configured to multiply a reference clock signal by a multiplication factor received from the logic unit and to output a test clock signal, an output terminal configured to serialize the test pattern signal based on the test clock signal and to output an output signal through an output pin, and an input terminal configured to recover a data signal and a data clock signal from an input signal of an input pin based on the output signal, to deserialize the data signal based on the data clock signal, and to output the test result signal to the logic unit.

According to some other embodiments of the inventive concepts, there is provided a digital display device which includes a logic unit and a video system frequency control circuit configured to operate in a normal mode to execute digital video display processing, and configured to operate in a test mode to executed a built-in self-test (BIST) process. The digital display device further includes an output terminal configured to serialize a test pattern signal based on a test clock signal and to output an output signal, and an input terminal configured to recover a data signal and a data clock signal from an input signal based on the output signal, to deserialize the data signal based on the data clock signal, and to output a test result signal to the logic unit. In the test mode, the logic unit is configured to generate the test pattern signal, receive the test result signal, and compare the test pattern signal with the test result signal to perform the BIST process. Also in the test mode, the video system frequency control circuit is configured to multiply a reference clock signal by a multiplication factor received from the logic unit and to output the test clock signal.

According to still some other embodiments of the inventive concepts, there is provided a test method of a data receiver device which includes detecting whether a current operational mode of the data receiver device is a test mode or a normal mode. Upon detecting that the current operational mode is the test mode, the test method further includes generating a test pattern signal and a predetermined multiplication factor corresponding to the test pattern signal, generating a test clock signal by multiplying a reference clock signal by the multiplication factor, serializing the test pattern signal based on the test clock signal, outputting an output signal by driving a serialized test pattern signal, equalizing an input signal based on the test pattern signal, recovering a data signal and a data clock signal from an equalized input signal, generating a test result signal by deserializing the data signal based on the data clock signal, and performing a test by comparing the test result signal with the test pattern signal.

BRIEF DESCRIPTION OF THE DRAWINGS

The above and other features and advantages of the inventive concept will become readily apparent from the detailed description that follows, with reference to the accompanying drawings, in which.

DETAILED DESCRIPTION OF THE EMBODIMENTS

Figure 1:
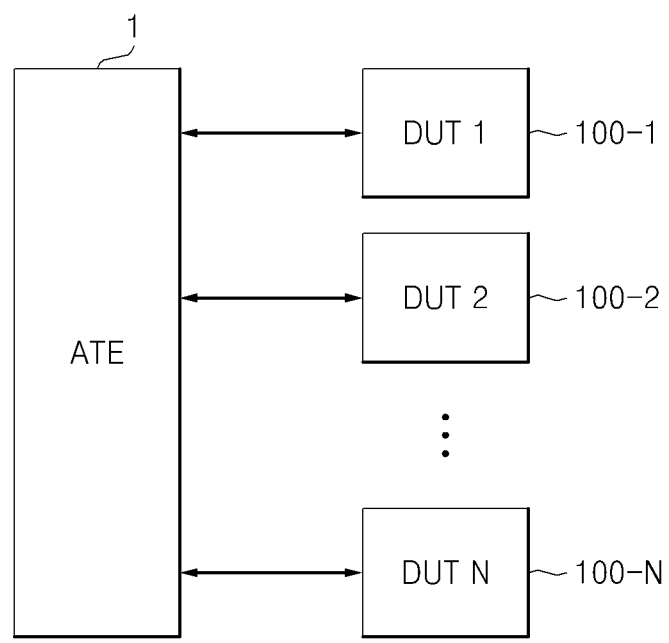
FIG. 1 is a block diagram of a device test system.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a conceptual diagram of an overall device test system. Referring to FIG. 1, the device test system includes at least one automatic test equipment (ATE) 1 and a plurality of devices-under-test (DUTs) 100 (100-1 to 100-n).

The ATE 1 is a test device that complies with industry test standards, such as standards of the Institute of Electrical and Electronics Engineers (IEEE). The ATE 1 tests a plurality of core blocks included in a DUT 100 to assess whether core blocks operate properly according to their characteristics. The ATE 1 is connected with the DUT 100 through a plurality of channels. For instance, the ATE 1 may include four input pins for receiving a test data input signal, a test mode input signal, a test clock signal, and a test rest signal, respectively, and one output pin for outputting a test data output signal.

The DUT 100 is the subject of testing, i.e., a device under test (DUT) which may include a plurality of cores having various functions. The DUT 100 may be a system on chip (SoC), a microprocessor, or a very large system integration (VLSI) device. The DUT 100 is connected to the ATE 1 through a plurality of channels.

The DUT 100 is a data receiver in the embodiments of the inventive concept. For example, the DUT 100 may be a display device having a digital display interface. In the examples provided herein, the digital display interface is the DisplayPort interface developed by the Video Electronics Standards Association (VESA). The DUT 100 of this example thus supports an interface mode that combines low-voltage differential signaling (LVDS), which is an internal interface standard, and digital visual interface (DVI), which is an external connection standard.

The DisplayPort interface allows both internal connection between a chip and a chip and external connection between a product and a product to be digitized. It broadens the data bandwidth and thus to be able to support high color depth and resolution. In addition, the DisplayPort interface is equipped with a bi-directional auxiliary channel and thus to support applications such as video chatting and voice over Internet protocol (VoIP) without additional interface.

Testing of a DisplayPort device (i.e., a device supporting the DisplayPort interface) includes a link clock lock test, a symbol lock test, a pseudo random bit sequence (PRBS) counter test, and a bit error rate (BER) test.

As suggested above, the DisplayPort device (DUT 100) of this embodiment is a DisplayPort receiver device including only a receiver. However, this is for convenience of description. That is, the DisplayPort device may instead be a DisplayPort transceiver device including both a transmitter and a receiver, or a DisplayPort transmitter device including only a transmitter.

Figure 2:
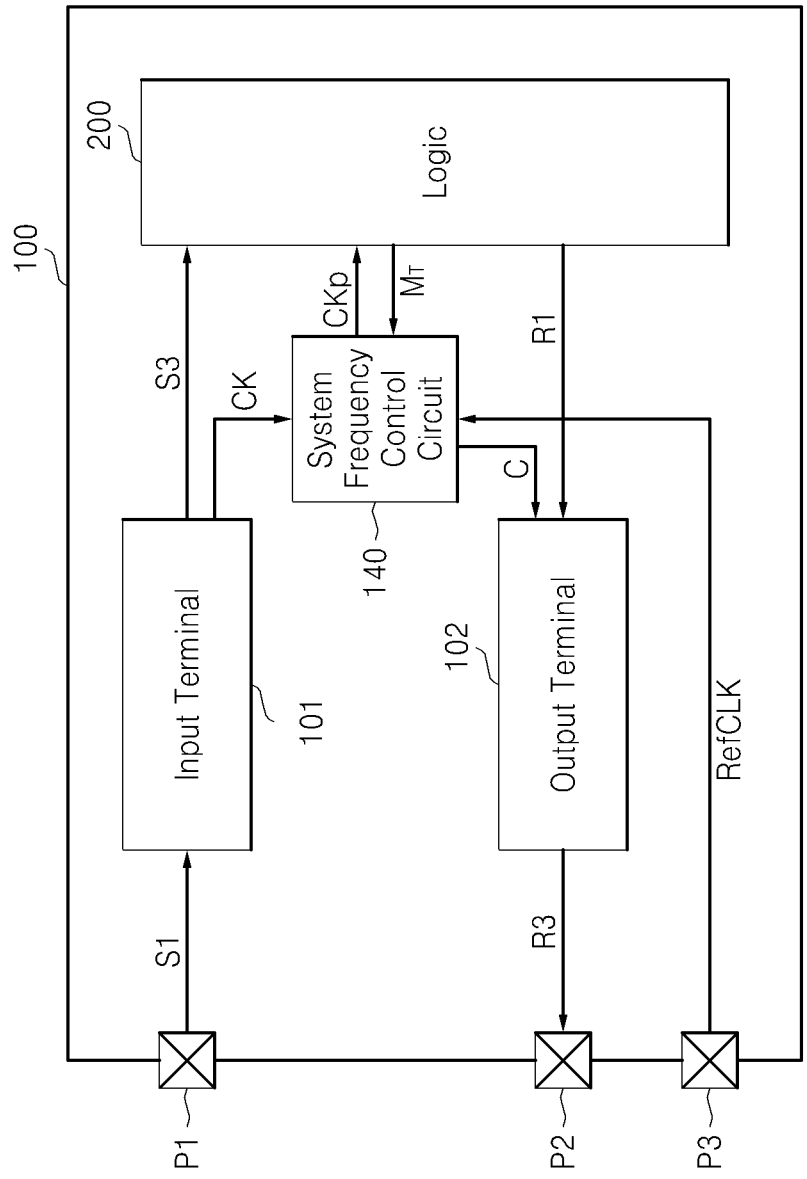
FIG. 2 is a block diagram of a data receiver device in a test mode according to some embodiments of the inventive concept.

FIG. 2 is a block diagram of a data receiver device 100 according to some embodiments of the inventive concept. Referring to FIG. 2, the data receiver device 100 includes a plurality of pins including an input pin P1 and an output pin P2, an input terminal 101, a system frequency control circuit 140, an output terminal 102, and a logic unit 200.

In a normal mode or a test mode, the input terminal 101 recovers a data signal and a data clock signal CK from an input signal S1 based on an output signal R3, deserializes the data signal based on the data clock signal CK, and outputs a test result signal S3 to the logic unit 200. The system frequency control circuit 140 multiplies the data clock signal CK by a multiplication factor M received from the logic unit 200 and outputs an operating clock signal C. At this time, the system frequency control circuit 140 may use the data clock signal CK as it is or may generate the operating clock signal C by multiplying the data clock signal CK by the predetermined multiplication factor M to be suitable to each system element. The multiplication factor M may be set by a user and may be changed in response to a test pattern signal or the test result signal S3.

In the normal mode, the output terminal 102 serializes a pattern signal R1 based on the operating clock signal C and generates the output signal R3.

The logic unit 200 generates the pattern signal R1 and receives the test result signal S3 in the normal mode. The logic unit 200 may control elements necessary for the operation of the data receiver device 100.

Figure 3:
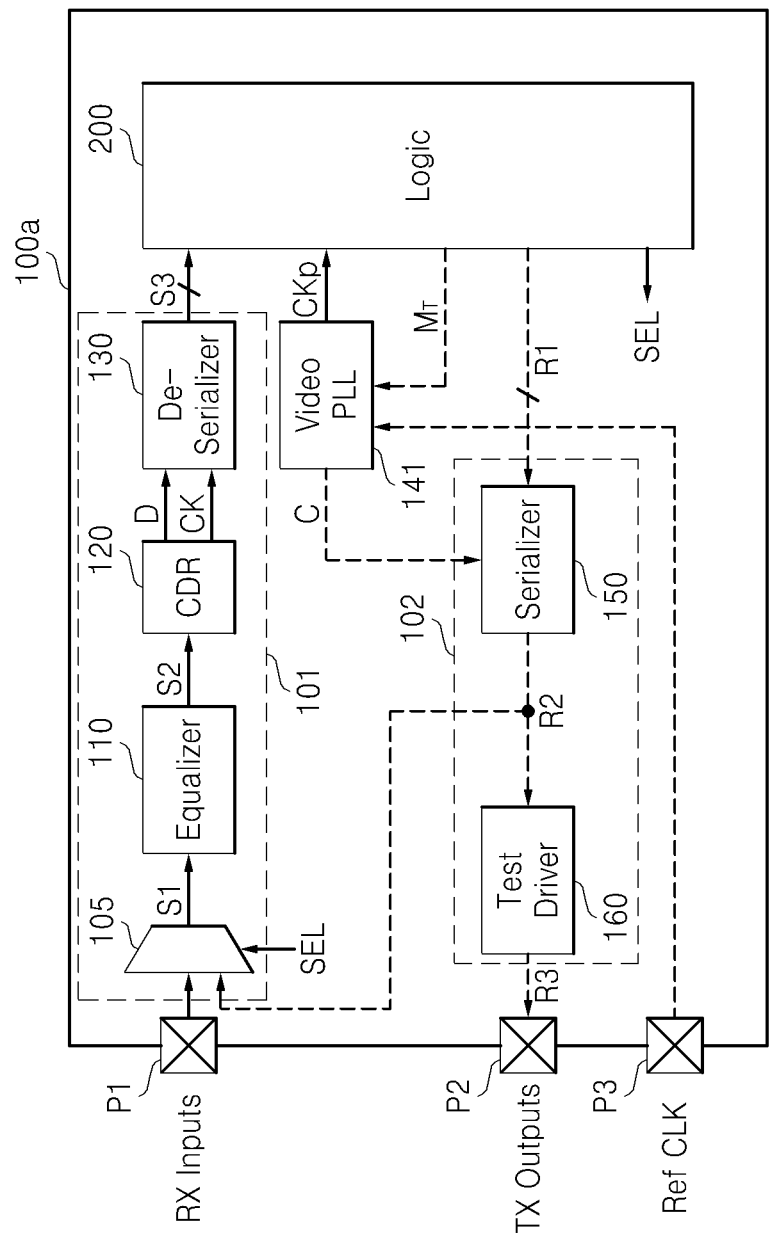
FIG. 3 is a diagram of a data receiver device that executes testing using an internal path in a test mode according to some embodiments of the inventive concept.

FIG. 3 is a diagram of a data receiver device 100a that executes testing using an internal path in the test mode according to some embodiments of the inventive concept. Referring to FIG. 3, the data receiver device 100a includes a plurality of pins including the input pin P1, the output pin P2, and a reference clock input pin P3; an equalizer 110; a clock-data recovery (CDR) unit 120; a deserializer 130; a video frequency control circuit 141; a serializer 150; a test driver 160; and the logic unit 200.

In the test mode, the input terminal 101 recovers a data signal and a data clock signal from an input signal Si based on an output signal, deserializes the data signal based on the data clock signal, and outputs a test result signal to the logic unit 200. The input terminal 101 includes the equalizer 110, the CDR unit 120, and the deserializer 130. The input terminal 101 may also include a selector 105.

In the test mode, the output terminal 102 serializes a test pattern signal based on a test clock signal to thus generate an output signal. The output terminal 102 includes the serializer 150 and the test driver 160.

The logic unit 200 detects whether the data receiver device 100 is in the test mode or the normal mode. After detecting the operation mode of the data receiver device 100, the logic unit 200 controls the elements of the data receiver device 100 according to the detected mode.

In the test mode, the logic unit 200 generates a test pattern signal R1 and receives a test result signal S3. The logic unit 200 also receives a pixel clock signal CKp from the video frequency control circuit 141.

In the test mode, the logic unit 200 compares the test pattern signal R1 with the test result signal S3 to perform a test. The test may include the PRBS counter test, the BER test, and so on. For instance, the logic unit 200 may compare the test pattern signal R1 with the test result signal S3 to test the BER of the test result signal S3.

The logic unit 200 outputs a predetermined multiplication factor M to the video frequency control circuit 141 according to the test pattern signal R1. The logic unit 200 may also output a control signal SEL to use the internal path.

The data receiver device 100a may also include the selector 105 to perform a built-in self-test (BIST) using the internal path. The selector 105 is connected between the input pin P1 and the equalizer 110 and may selectively output a serialized test pattern signal R2 or the input signal according to the control signal SEL of the logic unit 200.

The equalizer 110 equalizes the input signal S1 input to the data receiver device 100a or the serialized pattern signal R2. The logic unit 200 controls the selector 105 to output the serialized pattern signal R2 to the equalizer 110 in the test mode using the internal path. The logic unit 200 controls the selector 105 to output the input signal S1 to the equalizer 110 in the normal mode or the test mode using an external path.

The CDR unit 120 recovers a data clock signal CK and a data signal D from an equalized signal S2.

The deserializer 130 deserializes the data signal D based on the data clock signal CK to thus output the result signal S3. In other words, the deserializer 130 converts the serial data signal D into a parallel signal using the data clock signal CK and outputs the result signal S3 to the logic unit 200. The data receiver device 100a receives a reference clock signal RefCLK for a test through the reference clock input pin P3 in the test mode.

The video frequency control circuit 141 multiplies the reference clock signal RefCLK by the multiplication factor M received from the logic unit 200 and outputs a test clock signal C. At this time, the video frequency control circuit 141 may output the reference clock signal RefCLK as the test clock signal C or may multiply the reference clock signal RefCLK by the multiplication factor M to output the test clock signal C suitable to each system element.

The serializer 150 receives the test pattern signal R1 from the logic unit 200 and serializes the test pattern signal R1 based on the test clock signal C. In other words, the parallel test pattern signal R1 is converted into a serial signal using the test clock signal C and then output to the test driver 160.

The test driver 160 drives the serialized pattern signal R2 and outputs a signal R3 through the output pin P2.

As a result, the data receiver device 100a can perform the BIST in a package level as well as a wafer level by using the internal path without requiring an additional input/output pin. In addition, the data receiver device 100a uses a frequency control circuit, which has already been integrated into the data receiver device 100a, as a transmitter, and thus enables execution of the BIST without an additional design block.

Figure 4:
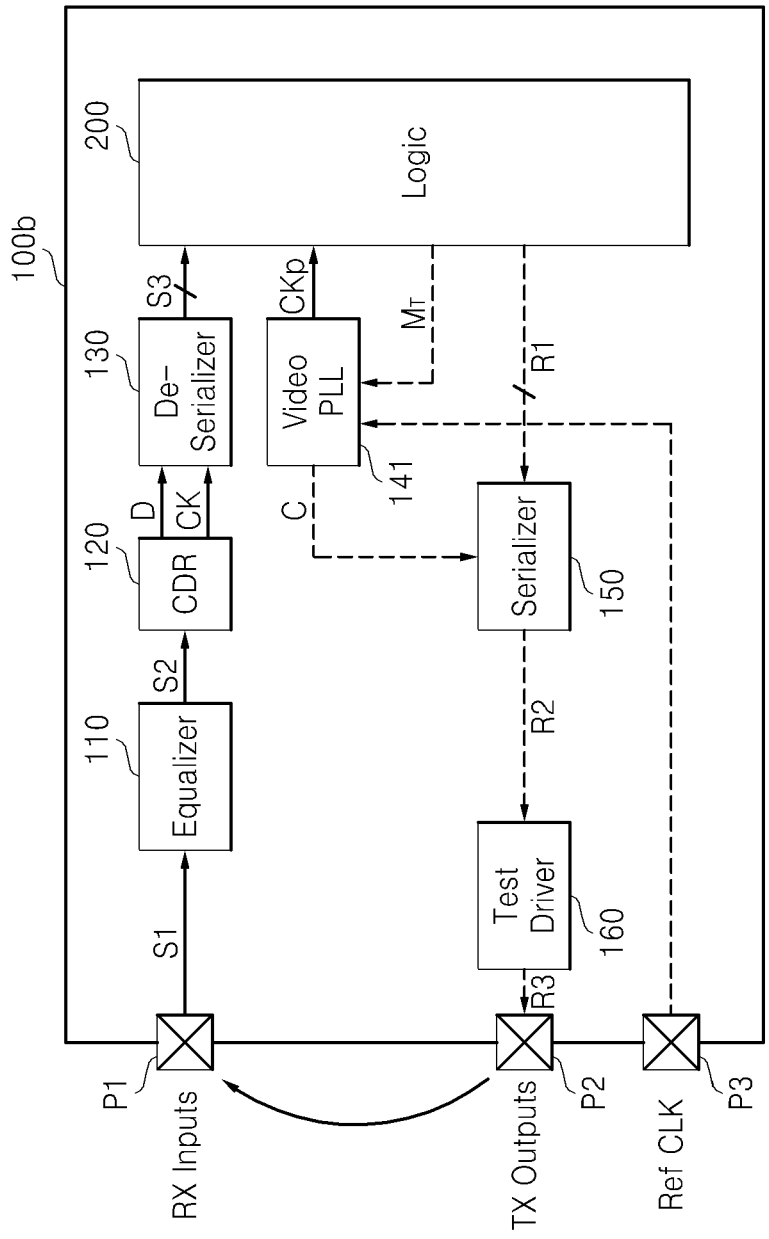
FIG. 4 is a diagram of a data receiver device that executes testing using an external path in a test mode according to other embodiments of the inventive concept.

FIG. 4 is a diagram of a data receiver device 100b that tests using an external path in the test mode according to other embodiments of the inventive concept. Referring to FIG. 4, the data receiver device 100b includes a plurality of pins including the input pin P1, the output pin P2, and an reference clock input pin P3; the equalizer 110; the CDR unit 120; the deserializer 130; the video frequency control circuit 141; the serializer 150; the test driver 160; and the logic unit 200.

In the test mode, the logic unit 200 generates a test pattern signal R1 and receives a test result signal S3. The logic unit 200 also receives a pixel clock signal CKp from the video frequency control circuit 141.

In the test mode, the logic unit 200 compares the test pattern signal R1 with the test result signal S3 to perform a test. The test may include the PRBS counter test, the BER test, and so on.

The data receiver device 100b may also include a selector (not shown) to perform the BIST using the external path.

The equalizer 110 equalizes the input signal Si input to the data receiver device 100b.

When the selector is not used, the equalizer 110 equalizes the input signal S1 obtained by feeding an output signal output through the output pin P2 back to the input pin P1. When the selector is used, the logic unit 200 controls the selector to output the input signal Si to the equalizer 110 in the normal mode or the test mode using the external path. At this time, the output pin P2 may be an auxiliary channel pin.

The CDR unit 120 recovers a data clock signal CK and a data signal D from an equalized signal S2. The deserializer 130 deserializes the data signal D based on the data clock signal CK and thus to output the result signal S3. In other words, the deserializer 130 converts the serial data signal D into a parallel signal using the data clock signal CK and outputs the result signal S3 to the logic unit 200.

The data receiver device 100b receives a reference clock signal RefCLK for a test through the reference clock input pin P3 in the test mode. The video frequency control circuit 141 multiplies the reference clock signal RefCLK by the multiplication factor M received from the logic unit 200 and outputs a test clock signal C. The video frequency control circuit 141 also outputs a pixel clock signal CKp to the logic unit 200 according to the reference clock signal RefCLK.

At this time, the video frequency control circuit 141 may output the reference clock signal RefCLK as the test clock signal C or may multiply the reference clock signal RefCLK by the multiplication factor M to output the test clock signal C suitable to each system element.

The serializer 150 receives the test pattern signal R1 from the logic unit 200 and serializes the test pattern signal R1 based on the test clock signal C. In other words, the parallel test pattern signal R1 is converted into a serial signal using the test clock signal C and then output to the test driver 160. The test driver 160 drives the serialized pattern signal R2 and outputs a signal R3 through the output pin P2.

As a result, the data receiver device 100b can perform the BIST in a package level as well as a wafer level by using the external path via the auxiliary channel pin. In addition, the data receiver device 100b uses a frequency control circuit, which has already been integrated into the data receiver device 100b, as a transmitter, and thus enables execution of the BIST without an additional design block.

Figure 5:
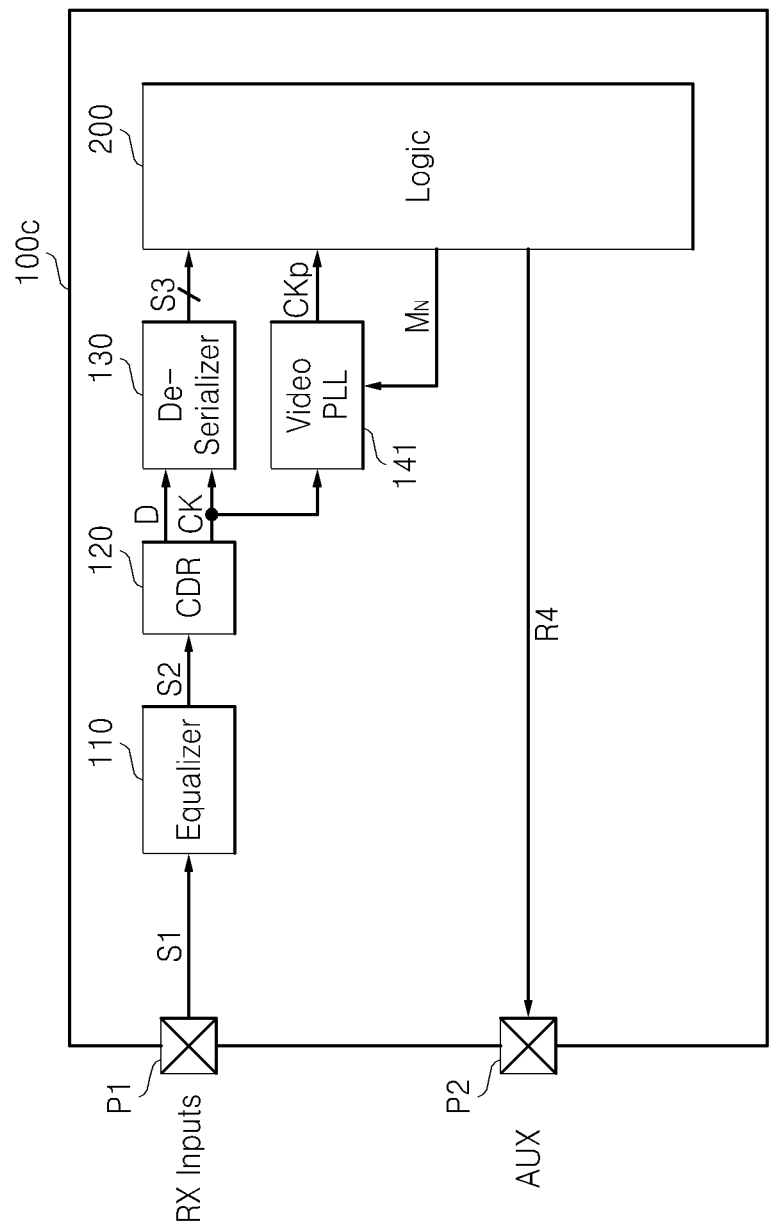
FIG. 5 is a detailed block diagram of a DisplayPort receiver device in a normal mode according to some embodiments of the inventive concept.

FIG. 5 is a detailed block diagram of a DisplayPort receiver device 100c in a normal mode according to some embodiments of the inventive concept. Referring to FIG. 5, the DisplayPort receiver device 100c may use elements of an input terminal but may not use elements (e.g., a serializer and a test driver) of an output terminal provided for the BIST in the normal mode.

The equalizer 110 equalizes the input signal Si input to the data receiver device 100c. The CDR unit 120 recovers a data clock signal CK and a data signal D from an equalized signal S2. The CDR unit 120 transmits the data clock signal CK to the video frequency control circuit 141 in the normal mode.

The deserializer 130 deserializes the data signal D based on the data clock signal CK and thus to output the result signal S3. In other words, the deserializer 130 converts the serial data signal D into a parallel signal using the data clock signal CK and outputs the result signal S3 to the logic unit 200.

The video frequency control circuit 141 multiplies the data clock signal CK by a multiplication factor M received from the logic unit 200 and outputs an operating clock signal C. The video frequency control circuit 141 also outputs a pixel clock signal CKp generated based on the data clock signal CK to the logic unit 200. At this time, the video frequency control circuit 141 may be implemented by a phase-locked loop (PLL) circuit or a delay-locked loop (DLL) circuit.

In other words, in the normal mode, the data receiver device 100c uses the data clock signal CK recovered by the CDR unit 120 as a base clock signal of the video frequency control circuit 141. As a result, the data receiver device 100c outputs a signal R4 based on the pixel clock signal CKp and the deserialized result signal S3 in the normal mode.

Figure 6:
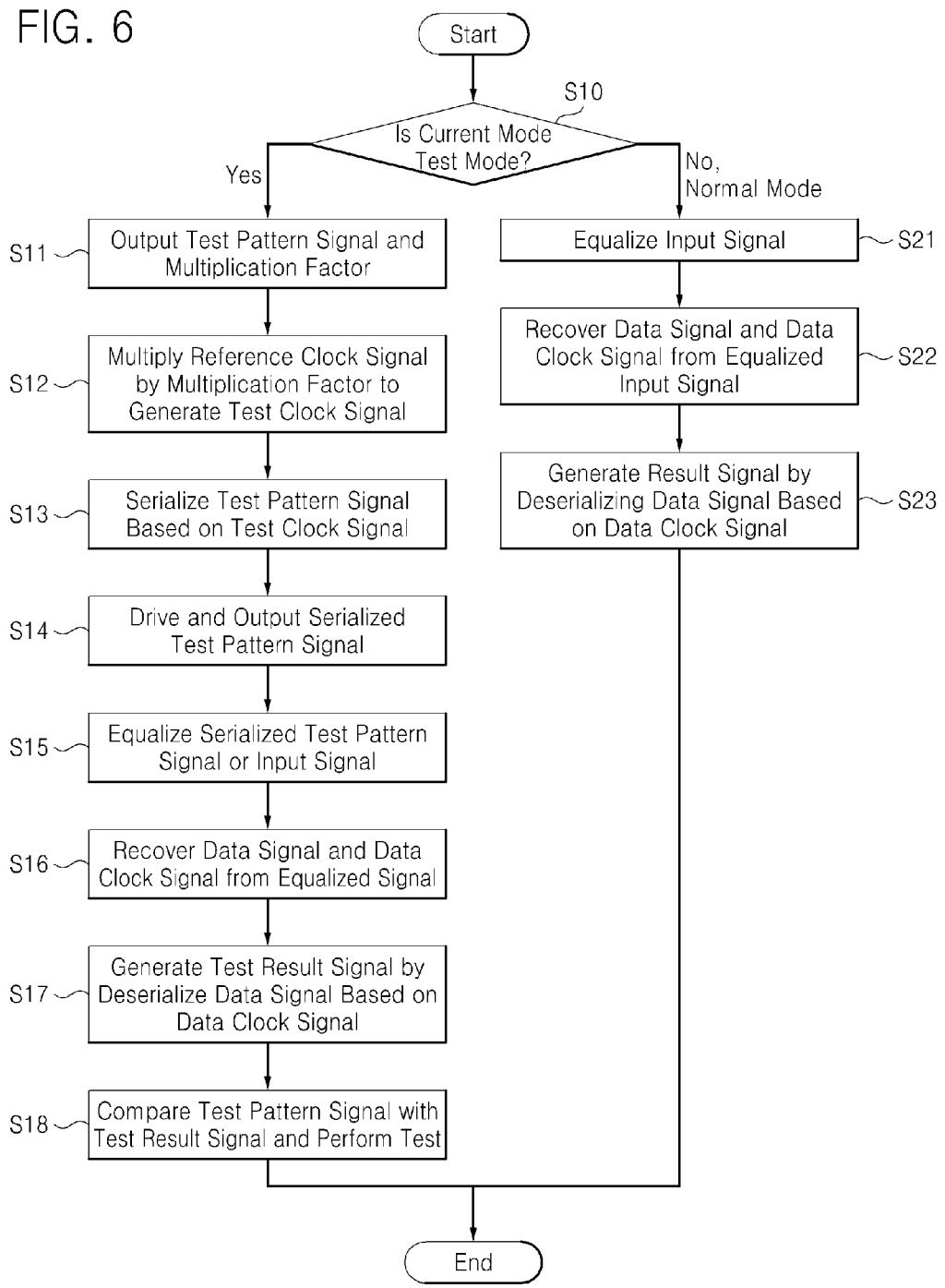
FIG. 6 is a flowchart of a test method of a data receiver device according to some embodiments of the inventive concept.

FIG. 6 is a flowchart of a test method of the data receiver device 100 according to some embodiments of the inventive concept. The data receiver device 100 detects whether a current operation mode is a test mode or a normal mode in operation S10. When it is detected that the current mode is the test mode, the logic unit 200 outputs the test pattern signal R1 and the predetermined multiplication factor M corresponding to the test pattern signal R1 in operation S11. The data receiver device 100 multiplies the reference clock signal RefCLK by the multiplication factor M and generates the test clock signal C in operation S12. The data receiver device 100b serializes the test pattern signal R1 based on the test clock signal C in operation S13 and drives the serialized test pattern signal R2 to output the output signal R3 in operation S14.

The data receiver device 100 equalizes the serialized test pattern signal R2 when it uses the internal path and equalizes the input signal Si corresponding to a feedback of the output signal R3 via the external path when the data receiver device 100 uses the external path in operation S15. The data receiver device 100 recovers the data signal D and the data clock signal CK from the equalized input signal in operation S16 and deserializes the data signal D based on the data clock signal CK to generate the test result signal S3 in operation S17.

As a result, the data receiver device 100 performs the BIST by comparing the test result signal S3 with the test pattern signal R1 in operation S18.

When it is detected that the current mode is the normal mode, the data receiver device 100 equalizes the input signal Si that is externally input in operation S21. The data receiver device 100 recovers the data signal D and the data clock signal CK from the equalized input signal in operation S22 and deserializes the data signal D based on the data clock signal CK in operation S23. As a result, the data receiver device 100 operates as a receiver device by driving and outputting the deserialized result signal R4.

Figure 7:
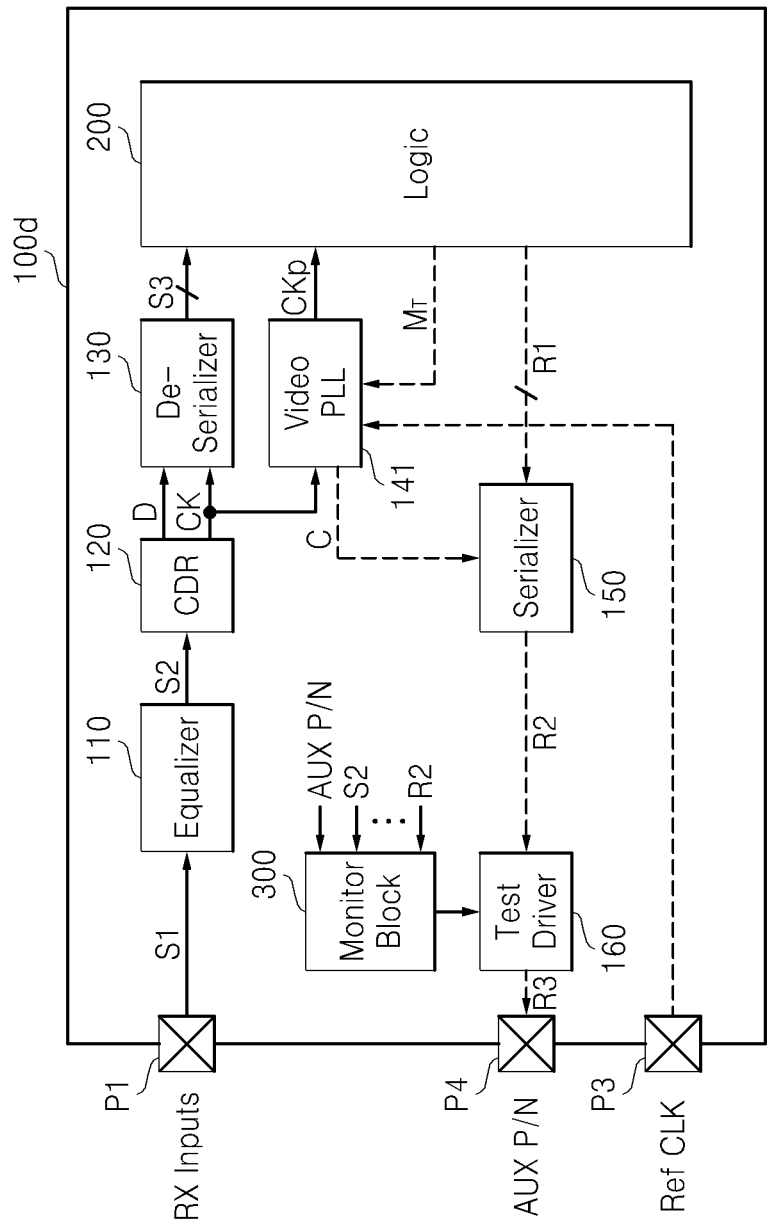
FIG. 7 is a diagram of a data receiver device according to further embodiments of the inventive concept.

FIG. 7 is a diagram of a data receiver device 100d according to further embodiments of the inventive concept. To avoid redundancy, only those differences between the data receiver device 100d and the data receiver device 100, 100a, and 100b illustrated in FIGS. 2 through 4 will be described. Referring to FIG. 7, the data receiver device 100d may further include a monitor block 300.

The monitor block 300 outputs a signal resulting from monitoring at least one of all signals generated in the data receiver device 100d to the test driver 160. For instance, the monitor block 300 may monitor the signal S2 generated by the equalizer 110, the signal D or CK generated by the CDR unit 120, the signal S3 generated by the deserializer 130, a signal C generated by the video frequency control circuit 141, the signal R3 generated by the test driver 160, the signal R2 generated by the serializer 150, and the signal R1 generated by the logic unit 200 to check whether each element operates normally.

The test driver 160 drives and outputs the monitored signal.

The ATE 1 may receive the monitored signal from the data receiver device 100d and verify whether each element of the data receiver device 100d operates normally.

As described above, according to some embodiments of the inventive concept, a frequency control circuit, which has already been integrated into a data receiver device, is used as a transmitter, and therefore, a BIST can be performed without an additional design block. In addition, a chip area can be reduced and the BIST can be performed in both a wafer level and a package level by using the frequency control circuit integrated into the data receiver device as a transmitter.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A data receiver device operative in either of a test mode and a normal mode, the data receiver device comprising:

a logic unit configured to detect a current operational mode of the data receiver device, the logic unit configured during the test mode to generate a test pattern signal, receive a test result signal, and compare the test pattern signal with the test result signal to perform a test, the test pattern signal and the test result signal are respective parallel signals;

a system frequency control circuit configured during the test mode to multiply a reference clock signal by a multiplication factor received from the logic unit and to output a test clock signal;

an output terminal configured to serialize the test pattern signal based on the test clock signal and to output an output signal through an output pin; and an input terminal configured to serially receive an input signal at an input pin, to recover a data signal and a data clock signal from the input signal based on the output signal, to deserialize the data signal based on the data clock signal, and during the test mode to output the test result signal to the logic unit responsive to the deserialized data signal.

2. The data receiver device of claim 1, wherein the output terminal comprises:
   a serializer configured to serialize the test pattern signal based on the test clock signal; and
   a test driver configured to output the output signal obtained by driving the serialized test pattern signal through the output pin.

3. The data receiver device of claim 1, wherein the input terminal comprises:
   an equalizer configured to equalize a frequency range of the input signal based on the output signal;
   a clock data recovery unit configured to recover the data signal and the data clock signal from an equalized input signal; and
   a deserializer configured to deserialize the data signal based on the data clock signal and to output the test result signal.

4. The data receiver device of claim 1, wherein the system frequency control circuit multiplies the data clock signal by the multiplication factor to output an operating clock signal in the normal mode and multiplies the reference clock signal by the multiplication factor to output the test clock signal in the test mode.

5. The data receiver device of claim 3, wherein the input terminal further comprises a selector configured to be connected between the input pin, the output terminal and the equalizer, and configured to selectively output one of a serialized test pattern signal and the input signal according to control of the logic unit.

6. The data receiver device of claim 5, wherein the selector selects and outputs the serialized test pattern signal in the test mode according to the control of the logic unit.

7. The data receiver device of claim 1, wherein during the test mode the input signal is the output signal that has been output through the output pin and then received through the input pin.

8. The data receiver device of claim 7, wherein the output pin is an auxiliary channel input/output pin.

9. The data receiver device of claim 1, wherein the logic unit outputs the multiplication factor to the system frequency control circuit according to the test pattern signal.

10. The data receiver device of claim 1, wherein the logic unit compares the test pattern signal with a pattern of the test result signal to test a bit error rate of the test result signal.

11. A digital display device comprising:
   a logic unit and a video system frequency control circuit configured to operate in either of a normal mode to execute digital video display processing and a test mode to execute a built-in self-test (BIST) process;
   an output terminal configured during the test mode to serialize a test pattern signal based on a test clock signal and to output an output signal; and
   an input terminal configured to serially receive an input signal, to recover a data signal and a data clock signal from the input signal based on the output signal, to deserialize the data signal based on the data clock signal, and during the test mode to output a test result signal to the logic unit, the test pattern signal and the test result signal are respective parallel signals, wherein, in the test mode, the logic unit is configured to generate the test pattern signal, receive the test result signal, and compare the test pattern signal with the test result signal to perform the BIST process, and
   wherein, in the test mode, the video system frequency control circuit is configured to multiply a reference clock signal by a multiplication factor received from the logic unit and to output the test clock signal.

12. The digital display device of claim 11, wherein an interface of the digital display device complies with a DisplayPort interface standard.

13. The digital display device of claim 11, wherein the video system frequency control circuit multiplies the data clock signal by the multiplication factor to output an operating clock signal in the normal mode, and multiplies the reference clock signal by the multiplication factor to output the test clock signal in the test mode.

14. The digital display device of claim 11, wherein the input terminal comprises a selector configured to be connected between an input pin that receives the input signal, the output terminal and an equalizer, and configured to selectively output one of the serialized test pattern signal and the input signal according to control of the logic unit.

15. The digital display device of claim 14, wherein the selector selects and outputs the serialized test pattern signal in the test mode according to the control of the logic unit.

16. A test method of a data receiver device, the test method comprising detecting whether a current operational mode of the data receiver device is a test mode or a normal mode, wherein upon detecting that the current operational mode is the test mode, the test method further comprising:
   generating a test pattern signal and a predetermined multiplication factor corresponding to the test pattern signal;
   generating a test clock signal by multiplying a reference clock signal by the multiplication factor;
   serializing the test pattern signal based on the test clock signal;
   outputting an output signal by driving the serialized test pattern signal;
   serially receiving an input signal;
   equalizing the input signal based on the test pattern signal;
   recovering a data signal and a data clock signal from the equalized input signal;
   generating a test result signal by deserializing the data signal based on the data clock signal; and
   performing a test by comparing the test result signal with the test pattern signal, the test pattern signal and the test result signal are respective parallel signals.

17. The test method of claim 16, wherein the input signal is received by feeding the output signal, which is externally output by the data receiver device, back to the data receiver device.

18. The test method of claim 16, wherein the input signal is obtained by internally feeding back the serialized test pattern signal through the data receiver device.

19. The test method of claim 16, wherein said performing the test comprises comparing the test pattern signal with a pattern of the test result signal and testing a bit error rate of the test result signal.

20. The test method of claim 16, wherein an interface of the data receiver device comprises a DisplayPort interface standard.

* * * * *